United States Patent [19]

Saitou et al.

[11] 4,275,312
[45] Jun. 23, 1981

[54] MOS DECODER LOGIC CIRCUIT HAVING REDUCED POWER CONSUMPTION

[75] Inventors: Tsuyoshi Saitou, Fuchu; Tsuneo Ito, Kodaira, both of Japan

[73] Assignee: Hitachi, Ltd., Tokyo, Japan

[21] Appl. No.: 964,894

[22] Filed: Nov. 30, 1978

[30] Foreign Application Priority Data

Dec. 9, 1977 [JP] Japan .................................. 52-147089

[51] Int. Cl.³ .................. H03K 19/094; H03K 19/20; G11C 8/00
[52] U.S. Cl. .................................. 307/463; 307/449; 365/227; 365/230
[58] Field of Search ......... 307/205, 270, 251, DIG. 5; 365/227, 230

[56] References Cited

U.S. PATENT DOCUMENTS

| | | | |
|---|---|---|---|
| 3,702,926 | 11/1972 | Picciano et al. | 307/DIG. 5 X |
| 3,765,003 | 10/1973 | Paivinen et al. | 307/DIG. 5 X |
| 3,778,784 | 12/1973 | Karp et al. | 307/DIG. 5 X |
| 3,909,806 | 9/1975 | Uchida | 307/DIG. 5 X |
| 3,936,810 | 2/1976 | Dunn | 307/DIG. 5 X |
| 3,980,899 | 9/1976 | Shimada et al. | 307/DIG. 5 X |
| 4,027,174 | 5/1977 | Ogata | 307/DIG. 5 X |
| 4,074,237 | 2/1978 | Spampinato | 365/230 |
| 4,096,584 | 6/1978 | Owen et al. | 307/DIG. 5 X |

FOREIGN PATENT DOCUMENTS 46-1767  1/1971  Japan ....................................... 307/205

Primary Examiner—Larry N. Anagnos
Attorney, Agent, or Firm—Craig & Antonelli

[57] ABSTRACT

The present invention relates to a transistor circuit, and more specifically to a static decoder circuit made up of a series circuit of a NOR logic gate circuit consisting of a plurality of MISFET's for receiving address signals through the gates, an inverter circuit for receiving the output of the logic gate circuit through the gate, a first MISFET for receiving the output of the logic gate circuit through the gate, and a second MISFET for receiving the output of the inverter circuit through the gate, wherein said NOR logic gate circuit and inverter circuit are connected to a ground terminal via a first switching MISFET which receives the control signals through the gate, and said series circuit is connected to a power supply terminal via a second switching MISFET which receives the control signals through the gate. According to the circuit of the present invention, said first and second switching MISFET's are rendered off by said control signals during the standby periods, such that the current pass is completely interrupted between the power supply terminal and the ground terminal in the decoder circuit, and the output of the decoder circuit is rendered to acquire the ground level.

11 Claims, 6 Drawing Figures

MOS DECODER LOGIC CIRCUIT HAVING REDUCED POWER CONSUMPTION

BACKGROUND OF THE INVENTION

1. Field of the Invention

The present invention is related to a transistor circuit consisting of a plurality of metal insulated gate field effect transistors (hereinafter referred to as MISFET's). More specifically, the invention deals with a decoder circuit employed in a MIS static memory circuit.

2. Description of the Prior Art

A static memory circuit based on an inverter circuit of the ratio type does not require a complicated refreshing circuit for regularly refreshing the memory cells so that there is no extinguishment of the stored information in memory cells generally used in a dynamic memory circuit based on an inverter circuit of the ratioless type, and also does not require clock circuits for clock-driving the circuits surrounding the memory cells. However, a problem remains in that the static memory circuits consume a great amount of electric power as compared with the dynamic memory circuit. In driving the memory circuits, in general, a considerable proportion of the electric power is consumed by the peripheral circuits, especially by the decoder circuits.

When the static memory circuits are to be employed for the main memory portion of large computers, therefore, it is required that the decoder circuit consume a reduced amount of electric power during stand-by periods.

Here, the inverter circuit of the abovementioned ratio type determines the output level depending upon the ratio of the resistance of a load MISFET to the resistance of a driver MISFET, while the inverter circuit of the ratioless type determines the output level depending upon whether an electric charge accumulated in a capacitor is discharged or not. Therefore, with the inverter circuit of the ratioless type there is substantially no current pass between the power source and ground.

There are known static decoder circuits equipped with power switches $T_8$ and $T_1$ that are driven by clock pulse signals, as shown in FIGS. 1 and 2, such that the consumption of electric power could be minimized. During the operating period, the clock pulse signal acquires an "H" level (high level, $V_{cc}$) to turn on the power switches $T_8$ and $T_1$. During the stand-by period, on the other hand, the clock pulse signal acquires an "L" level (low level, zero volt) to turn off the power switches $T_8$ and $T_1$.

Referring to the decoder circuit shown in FIG. 1, the power switch $T_8$ is provided on the grounded side of a gate circuit composed of MISFET's $T_2$ to $T_7$. The power switch $T_8$ is turned off during the stand-by periods. Therefore, a current pass between a power supply $V_{cc}$ and ground in the decoder circuit is interrupted by the power switch $T_8$. However, the inventors of the present invention have analyzed the circuit and confirmed that the output signal level from the output terminal XN attains the "H" level, causing the MISFET's in a memory cell array (not shown) to turn on giving rise to the development of a current pass from a common load MISFET of the memory cell array to ground.

Referring to the decoder circuit shown in FIG. 2, on the other hand, the power switch $T_1$ is provided on the side of a power supply $V_{cc}$ of a gate circuit composed of MISFET's $T_3$ to $T_8$. Here, the power switch $T_1$ is a MISFET of the depletion type of which the threshold voltage level is set at near zero volt. Symbol $T_{12}$ represents a MISFET of the depletion type which compensates the level during the periods of long cycles or when the selection time has continued for long periods of time. It was, however, confirmed by the inventors of the present invention through circuit analysis that even the decoder circuit shown in FIG. 2 gives rise to the defects mentioned below during the stand-by periods.

(1) When at least one of the address signals fed to address input terminals ($a_0$ to $a_5$) is at the "H" level.

In this case, since the depletion type MISFET $T_1$ is not completely turned off, an electric current flows from the power supply $V_{cc}$ to ground through MISFET's $T_1$ and $T_2$.

(2) When address signals fed to the address input terminals are all at the "L" level.

In this case, an "H" level signal is applied to a point A, whereby a MISFET $T_{10}$ is turned on. Therefore, an electric current flows from the power supply $V_{cc}$ into ground through MISFET's $T_9$ and $T_{10}$.

Accordingly, the decoder circuit shown in FIG. 2 is not capable of completely interrupting the current pass during the stand-by periods.

It is therefore desired to provide a static decoder circuit which does not develop such a current pass and which consumes less electric power.

SUMMARY OF THE INVENTION

A primary object of the present invention, therefore, is directed to minimize the consumption of electric power by the transistor circuit.

Another object of the present invention is to provide a decoder circuit which is suited for use in a static memory circuit.

In order to accomplish the abovementioned objects, the below-mentioned two points were taken into consideration.

1. To completely interrupt the current pass in the decoder circuit during the stand-by periods; and
2. To set the output signals of the decoder circuit at the "L" level during the stand-by periods.

As a result, the gist of the present invention is as follows. A MISFET which receives address decode signals through the gate and a first MISFET which receives control signals through the gate are connected in series between a first reference potential terminal and an output terminal, a MISFET which receives the abovesaid address decode signals through the gate via an inverter circuit consisting of a MISFET is connected between the abovesaid output terminal and a second potential terminal, and a second MISFET which receives control signals through the gate is connected between the abovesaid inverter circuit and a second reference potential terminal, wherein the first and second MISFET's are turned on by the abovesaid control signals during the operating periods of the static MIS memory, and are turned off during the stand-by periods.

The above and other objects, features and advantages of the present invention will become apparent from the following description of the embodiments of the invention when taken in conjunction with the accompanying drawings.

DESCRIPTION OF THE PREFERRED EMBODIMENTS

Figure 3:
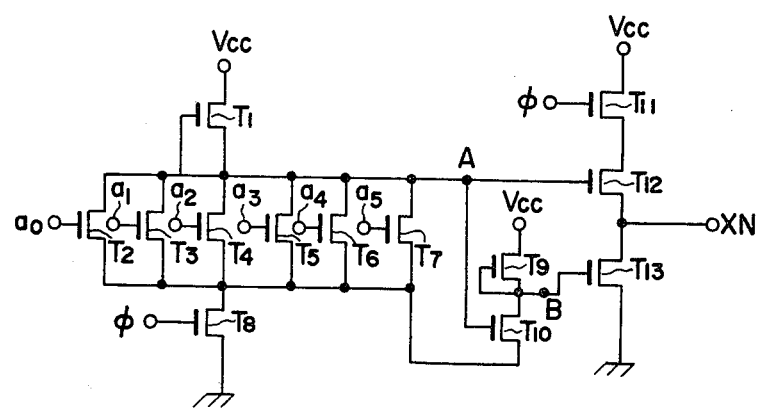
FIG. 3 is a diagram showing a static decoder circuit employing a transistor circuit according to the present invention.

The static decoder circuit of the present invention shown in FIG. 3 is illustrated below.

Referring to FIG. 3, symbol $T_1$ represents a load MISFET, and symbols $T_2$ to $T_7$ represent driver MISFET's of the N-channel type constituting a NOR Logic gate circuit.

Symbol $T_9$ denotes a load MISFET of the N-channel type, and $T_{10}$ a driver MISFET of the N-channel type; these two MISFET's constitute a single inverter circuit. Symbol $T_{12}$ denotes a MISFET of the N-channel type to whose gate electrode will be fed output signals, i.e., address decode signals of the NOR logic gate circuit, $T_{13}$ an N-channel MISFET to whose gate electrode will be fed output signals of the inverter circuit, and $T_8$ and $T_{11}$ designate switching MISFET's each consisting of an N-channel MISFET, of which the gate electrodes are connected to a control signal terminal $\phi$ such that control signals (clock pulse signals) are fed thereto. The control signals will acquire the "H" level (5 volts) and the "L" level (zero volt) alternatingly and periodically. During the operating periods, the control signal acquires the "H" level and turns on the power switches $T_8$ and $T_{11}$. During the stand-by periods, on the other hand, the control signal acquires the "L" level to turn off the power switches $T_8$ and $T_{11}$. Symbol Vcc represents a voltage source terminal to which is supplied a voltage source potential of 5 volts. Further, symbols $a_0$, $a_1$, $a_2$, $a_3$, $a_4$ and $a_5$ denote address input terminals to which are supplied address input signals at the "H" level and "L" level. Symbol XN represents an output terminal of the static decoder circuit.

The operation of the static decoder circuit is illustrated below.

(1) Stand-by period when the address decoder circuit is selected, i.e., when the address decode signal at the "H" level is produced at the output terminal XN:

The address signals fed to the address input terminals $a_0$ to $a_5$ are all at the "L" level. Therefore, MISFET's $T_2$ to $T_7$ of the NOR logic gate circuit are all turned off. On the other hand, the control signal fed to the control signal terminal $\phi$ is at the "L" level, whereby the switching MISFET's $T_8$ and $T_{11}$ are turned off. Hence, the output point A in the NOR logic gate circuit acquires the "H" level through the load MISFET $T_1$. Although the MISFET 10 is turned on, the switching MISFET $T_8$ remains in an off state, whereby an output point B in the inverter circuit acquires the "H" level through the load MISFET $T_9$. Consequently, the MISFET $T_{13}$ is turned on.

Since the switching MISFET $T_{11}$ is turned off as mentioned above, a signal at the "L" level is drawn to the output terminal XN.

Even if the driver MISFET $T_{10}$ of the inverter circuit is turned on, the switching MISFET $T_8$ remains turned off, and further even if MISFET's $T_{12}$ and $T_{13}$ are turned on, the switching MISFET $T_{11}$ remains in an off state, such that no current pass is created between the power supply and ground.

(2) Operating period when the address decoder circuit is selected:

The control signal acquires the "H" level, and the switching MISFET's $T_8$ and $T_{11}$ are turned on. Therefore, the output point B of the inverter circuit acqures the "L" level, turning off the MISFET $T_{13}$. As a result, a signal at the "H" level is drawn to the output terminal XN through the switching MISFET $T_{11}$ and MISFET $T_{12}$.

(3) Stand-by period when the address decoder circuit is not selected, i.e., when an address decode signal at the "L" level is drawn to the output terminal XN:

An address signal at the "H" level is fed to at least one address input terminal among the address input terminals $a_0$ to $a_5$. For instance, an address signal at the "H" level is fed to the address input terminal $a_3$, and address signals at the "L" level are fed to other address input terminals $a_0$, $a_1$, $a_2$, $a_4$ and $a_5$. Therefore, the MISFET $T_5$ is turned on, and MISFET's $T_2$, $T_3$, $T_6$ and $T_7$ are turned off. On the other hand, since a control signal fed to the control signal terminal $\phi$ is at the "L" level, the switching MISFET's $T_8$ and $T_{11}$ are turned off. Accordingly, the output point A of the NOR logic gate circuit acquires the "H" level through the load MISFET $T_1$. As a result, the MISFET $T_{10}$ is turned off because the source potential is at the "H" level. MISFET's $T_{12}$ and $T_{13}$ are turned on. Therefore, a signal at the "L" level is drawn to the output terminal XN.

It will therefore be understood that even when at least one MISFET $T_5$ is turned on among the MISFET's of the NOR logic circuit, the switching MISFET $T_8$ remains off, whereby no current pass is developed between the power supply and ground. It will further be understood that no current pass develops in the inverter stage ($T_9$, $T_{10}$) and the output stage ($T_{11}$, $T_{12}$) because of the same reasons as mentioned in item (1) above.

(4) Operating period when the address decoder circuit is not selected:

The control signal acquires the "H" level, turning the switching MISFET's $T_8$ and $T_{11}$ on. Therefore, since the MISFET $T_5$ is in a conductive state, a current pass is created for the first time. The output level at the output point A of the NOR logic gate circuit is determined by the ratio of the resistance of the load MISFET $T_1$ to the resultant resistance of MISFET's $T_5$ and $T_8$. According to this embodiment, the resistance ratio is so selected that solely MISFET's $T_{10}$ and $T_{12}$ are rendered on, i.e., the output level is smaller than a threshold voltage level Vth of the MISFET's $T_{10}$ and $T_{12}$.

Consequently, the output at the output point A is at the "L" level. Therefore, the MISFET's $T_{10}$ and $T_{12}$ are turned off. Further, the output point B acquires the "H" level through the load MISFET $T_9$, causing the MISFET $T_{13}$ to be turned on. As a result, the output at the output terminal XN acquires the "L" level.

As will be obvious from the foregoing description, the switching MISFET's $T_8$ and $T_{11}$ in the static decoder circuit of the present invention are turned off during the stand-by periods, thereby to completely interrupt the following current passes:

Vcc→$T_1$→ground $Vcc \rightarrow T_9 \rightarrow T_{10} \rightarrow ground$ $Vcc \rightarrow T_{12} \rightarrow T_{13} \rightarrow ground$ Further, the outputs at the output points A and B acquire the "H" level irrespective of the address input signals fed to the address input terminals $a_0$ to $a_5$ rendering the MISFET $T_{13}$ conductive, so that the output terminal XN is always at the "L" level. It is therefore possible to interrupt the current pass through the load MISFET's in the memory array. This will be discussed later in further detail after the memory cell including a portion of the peripheral circuit shown in FIG. 4 used in combination with the decoder circuit of FIG. 3 is illustrated below.

Figure 4:
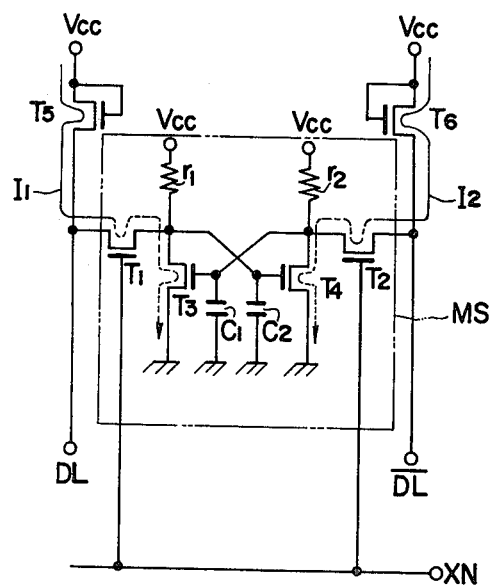
FIG. 4 is a diagram showing a static MIS memory cell consisting of a plurality of MISFET's connected to the output terminal of the decoder circuit shown in FIG. 3.

Referring to FIG. 4, the memory cell MS is composed of resistors $r_1$ and $r_2$, and MISFET's $T_1$, $T_2$, $T_3$ and $T_4$ of the N-channel type. Here, polysilicon resistors may be used as resistors $r_1$ and $r_2$. Further, MISFET's may be used instead of such resistors. Symbols $T_5$ and $T_6$ denote load MISFET's, the output terminal XN is an output terminal of the decoder circuit shown in FIG. 3, and DL and $\overline{DL}$ designate digit wires. In the memory cell MS, either one of the MISFET $T_3$ or $T_4$ is necessarily turned on and another one is turned off.

According to the decoder circuit of the present invention, the output signal at the output terminal XN is always at the "L" level during the stand-by periods, as mentioned earlier. Hence, no current pass as indicated by arrow $I_1$ or $I_2$ is established in the memory cell.

Figure 5:
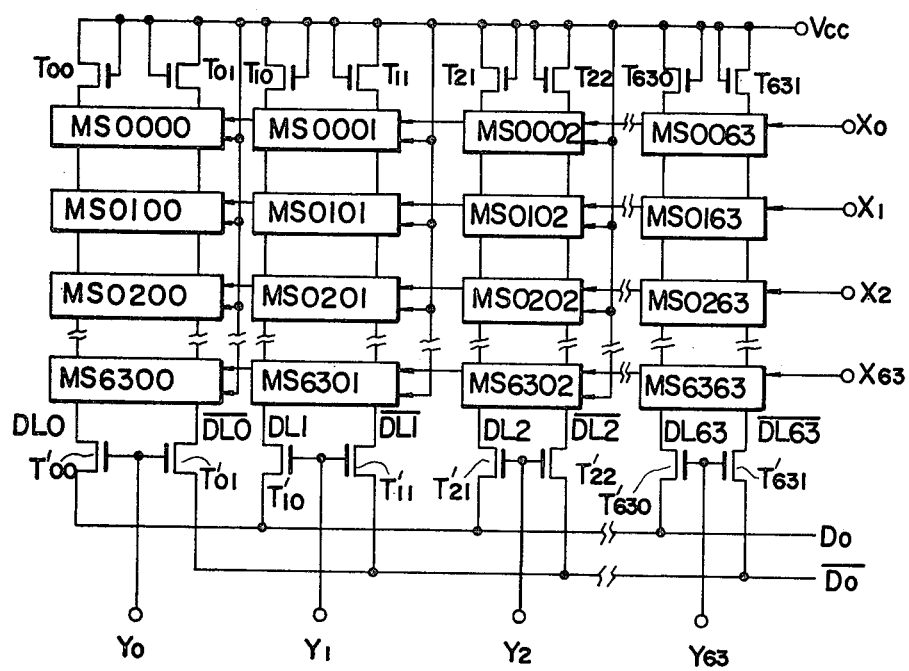
FIG. 5 is a diagram showing a 4096-word by 1 bit static memory array composed of static MIS memory cells shown in FIG. 4.

FIG. 5 shows a 4096-word by 1 bit static memory array made up of the static memory cells MS shown in FIG. 4.

Figure 1:
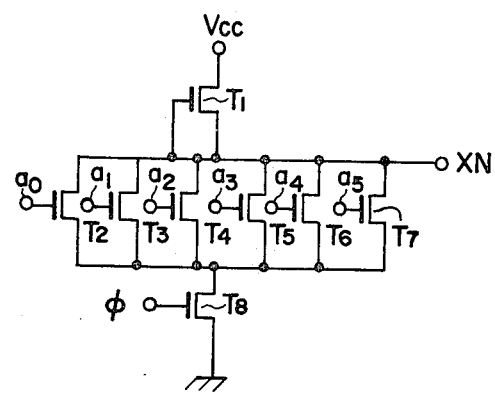
FIGS. 1 and 2 are diagrams showing static decoder circuits having a conventional power switch.

Symbols $X_0$, $X_1$,-$X_{63}$ denote output terminals of a plurality of X-decoder circuits each being made up of the decoder circuit of FIG. 3, and symbols $Y_0$, $Y_1$,-$Y_{63}$ denote output terminals of a plurality of Y-decoder circuits. Symbols $T_{00}$, $T_{01}$,-$T_{631}$ represent load MISFET's which are the same as the load MISFET's $T_5$ and $T_6$ of FIG. 4, and which are inserted between the digit wires DL0, $\overline{DL0}$,-DL63, $\overline{DL63}$ and the power source terminal. MS0000 to MS6363 are each composed of the memory cell MS shown in FIG. 4. Symbols $T'_{00}$, $T'_{01}$,-$T'_{631}$ represent transfer MISFET's connected to their respective digit wires, which receive the outputs of the Y-decoder circuits through their gates. In the Y-decoder circuits in which no current pass is established in the memory cells, there is no need to employ a decoder circuit shown in FIG. 3 of the present invention. Accordingly, the decoder circuit shown in FIG. 1 is used.

With the above memory cell array, when the output terminal $X_0$ selected from the output terminals $X_0$ to $X_{63}$ produces an output signal at the "H" level during the standby period, a current pass develops between the power supply and ground through 64 units of load MISFET's.

However, using the decoder circuit of the present invention, the output signal from the output terminal $X_0$ acquires the "L" level during the stand-by periods, whereby no current pass develops between the power supply and ground through load MISFET's $T_{00}$ to $T_{631}$. It will therefore be obvious that the consumption of electric power is remarkably reduced.

Figure 6:
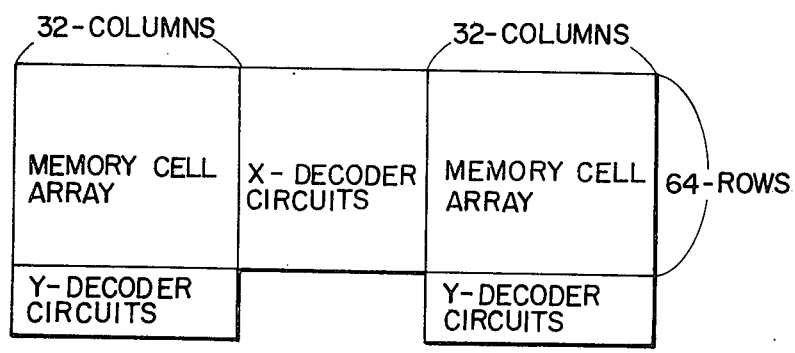
FIG. 6 is a diagram showing a 4096-word by 1 bit static memory circuit to illustrate the relation between the decoder circuit and the memory array.

FIG. 6 shows a layout of the 4096-word by 1 bit static memory circuit composed of the static memory cell array shown in FIG. 5 and the Y-decoder circuits.

As mentioned above, according to the present invention, it is possible to completely interrupt the current pass in the decoder circuits and in the static memory cells during the stand-by periods, enabling the consumption of electric power to be reduced.

Figure 2:
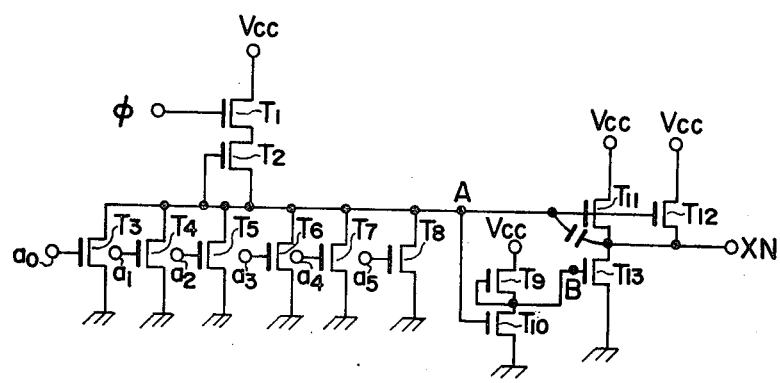

Further, comparing the decoder circuit of the present invention shown in FIG. 3 with the conventional decoder circuit shown in FIG. 2, both of which have the same number of elements, it will be understood that the switching MISFET $T_3$ of the present invention can be commonly used when the 4096-word by 1 bit static memory circuit is constructed. The MISFET $T_{12}$ for compensating the level of the conventional decoder circuit, however, is not commonly usable because an address decode signal is fed to the gate. Consequently, when the decoder circuit of the present invention is applied to the static memory circuit, the number of elements can be greatly reduced as compared with when the conventional decoder circuit shown in FIG. 2 is applied to the static memory circuit.

Although an embodiment of the present invention was described in the foregoing in conjunction with the drawings, it should be noted that the below-mentioned modifications are also allowable.

(1) When the X-decoder circuits of the 4096-word by 1 bit static memory array are constructed using the static decoder circuits shown in FIG. 3, the switching transistors $T_8$ and $T_{11}$ shown in FIG. 3 need not be connected to their respective decoder circuits. That is, the switching MISFET's $T_8$ and $T_{11}$ may be used as common switching MISFET's of the X-decoder circuits. Here, however, it is desirable to connect the switching MISFET $T_8$ to each of the decoder circuits. This is because, in the X-decoder circuits during operation, 63 units of the decoder circuits are not selected.

On the other hand, as mentioned earlier, the level of the output signal of the NOR logic gate circuit in the decoder circuit when it is not selected, is determined by the ratio of the resistance of the load MISFET $T_1$ to the resultant resistance of the MISFET in the NOR logic gate circuit and the switching transistor $T_8$. Therefore, when the switching MISFET $T_8$ is to be commonly used for a plurality of X-decoder circuits, the resistance of the switching MISFET $T_8$ must be decreased to as great an extent as possible. For this purpose, it is necessary to increase the area of the switching MISFET $T_8$. This, however, is not desirable because the switching MISFET $T_8$ occupies increased area when it is incorporated in a semiconductor chip. A difficulty in laying out the wiring also arises.

The switching MISFET $T_{11}$, on the other hand, produces an "H" level signal at the output terminal of a selected decoder circuit only, and is turned on. The switching MISFET $T_{11}$ can therefore be used as a common switching FET for the decoder circuits.

(2) Referring to the static decoder circuit shown in FIG. 3, the switching MISFET $T_8$ commonly utilizes the NOR logic gate circuit and the inverter circuit to reduce the number of MISFET's to as great an extent as possible. If necessary, however, another switching MISFET may be provided between a terminal of the MISFET $T_{10}$ and ground.

(3) Referring to FIG. 3, further, it is possible to use resistor loads instead of the load MISFET's $T_1$ and $T_9$.

While the present invention has been shown in connection with certain specific examples, it will be readily apparent to those skilled in the art that various changes in form and arrangement of parts may be made to suit the specific requirements without departing from the spirit and scope of the present invention.

What is claimed is:

1. A transistor circuit wherein a MISFET for receiving desired signals through the gate and a first switching MISFET for receiving control signals through the gate are connected in series between a first reference potential terminal and an output terminal, a second MISFET for receiving said desired signals through the gate via an inverter consisting of a MISFET is connected between said output terminal and a second reference potential terminal, and a second switching MISFET for receiving control signals through the gate is connected between said inverter circuit and said second reference potential terminal.

2. A transistor circuit according to claim 1, wherein a static MIS memory circuit is coupled to said output terminal, and said first and second switching MISFET's are rendered on by said control signals during the operating period of said static MIS memory circuit and rendered off during the stand-by period of said static MIS memory circuit.

3. A transistor circuit according to claim 2, wherein said static MIS memory circuit consists of a load MISFET of which at least one terminal is connected to said first reference potential terminal, a memory MISFET having means for storing information of which one terminal is connected to said second reference potential terminal, and a transferring MISFET connected between other terminal of said load MISFET and other terminal of said memory MISFET, and wherein the gate of said transferring MISFET is connected to said output terminal.

4. A transistor circuit according to claim 3, wherein said means for storing information consists of a capacitor, one terminal thereof being connected to the gate of said memory MISFET and the other terminal thereof being connected to said second reference potential terminal.

5. A transistor circuit according to claim 1, wherein said transistor circuit further includes a logic gate circuit having an input terminal for receiving a plurality of input signals and an output terminal for drawing output signals, and wherein said logic gate circuit is connected to said second reference potential terminal via said second switching MISFET, and said output terminal of said logic gate circuit is connected to the gate of said first MISFET and to said inverter circuit.

6. A decoder circuit comprising:
a logic gate circuit consisting of a common load MISFET connected to a first reference potential terminal, and a plurality of driver MISFET's connected in parallel with each other to receive address signals through their respective gates;
an inverter circuit consisting of a load MISFET connected to said first reference potential terminal, and a driver MISFET for receiving output signals of said logic gate circuit through the gate;
a first switching MISFET having first and second terminals, said first terminal being connected to said first reference potential terminal to receive the control signals through the gate;
a first MISFET connected between a second terminal of said first switching MISFET and an output terminal to receive the output signals of said logic circuit through the gate;
a second MISFET connected between said output terminal and a second reference potential terminal to receive the output signals of said inverter circuit through the gate; and
a second switching MISFET which receives, through the gate, control signals for connecting the plurality of driver MISFET's of said logic gate circuit and said driver MISFET of said inverter circuit to said second reference potential terminal.

7. A decoder circuit according to claim 6, wherein a static MIS memory circuit is coupled to said output terminal, said first and second switching MISFET's are rendered on by said control signals during the operating period of said static MIS memory circuit and rendered off during the standby period of said static MIS memory circuit.

8. A decoder circuit according to claim 7, wherein said static MIS memory circuit consists of a load MISFET of which at least one terminal is connected to said first reference potential terminal, a memory MISFET having means for storing information of which one terminal is connected to said second reference potential terminal, and a transferring MISFET connected between other terminal of said load MISFET and other terminal of said memory MISFET, and wherein the gate of said transferring MISFET is connected to said output terminal.

9. A decoder circuit according to claim 8, wherein said means for storing information consists of a capacitor, one terminal thereof being connected to the gate of said memory MISFET and other terminal thereof being connected to said second reference potential terminal.

10. A decoder circuit for MIS static memory circuit comprising;
a plurality of decoder circuits, each of which having a logic gate circuit consisting of a common load MISFET connected to a first reference potential terminal and a plurality of driver MISFET's connected in parallel with each other to receive address signals through their respective gates, an inverter circuit consisting of a load MISFET connected to said first reference potential terminal and a driver MISFET for receiving the output signals of said logic gate circuit through the gate, a series circuit consisting of a first MISFET for receiving the output signal of said logic gate circuit through the gate and a second MISFET for receiving the output signal of said inverter circuit through the gate, a first switching MISFET which receives, through the gate, control signals for connecting driver MISFET's of said logic gate circuit and the driver MISFET of said inverter circuit to a second reference potential terminal, and an output terminal connected between said first MISFET and said second MISFET; and
a second switching MISFET for receiving the control signals through the gate;
wherein the first MISFET of each of the decoder circuits is connected to said first reference potential terminal via said second switching MISFET.

11. A decoder circuit for MIS static memory circuit according to claim 10, wherein a plurality of static memory cells are connected in parallel with the output terminals of the individual decoder circuits.

* * * * *